(12) United States Patent
Kawachi et al.

(10) Patent No.: US 9,825,612 B2
(45) Date of Patent: Nov. 21, 2017

(54) MULTIPLEXER

(71) Applicant: TAIYO YUDEN CO., LTD., Tokyo (JP)

(72) Inventors: Osamu Kawachi, Tokyo (JP); Naoki Takahashi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 297 days.

(21) Appl. No.: 14/660,329

(22) Filed: Mar. 17, 2015

(65) Prior Publication Data

US 2015/0295697 A1    Oct. 15, 2015

(30) Foreign Application Priority Data

Apr. 10, 2014    (JP) .................. 2014-080762

(51) Int. Cl.
| | |
|---|---|
| *H03H 9/70* | (2006.01) |
| *H03H 9/72* | (2006.01) |
| *H04B 1/50* | (2006.01) |
| *H04J 1/12* | (2006.01) |
| *H04L 5/14* | (2006.01) |
| *H03H 9/02* | (2006.01) |
| *H03H 9/60* | (2006.01) |
| *H03H 9/64* | (2006.01) |

(52) U.S. Cl.
CPC ........ *H03H 9/725* (2013.01); *H03H 9/02574* (2013.01); *H03H 9/706* (2013.01); *H04B 1/50* (2013.01); *H04J 1/12* (2013.01); *H04L 5/14* (2013.01); *H03H 9/605* (2013.01); *H03H 9/6483* (2013.01)

(58) Field of Classification Search
CPC ........ H03H 9/605; H03H 9/6483; H03H 9/70; H03H 9/706; H03H 9/72; H03H 9/725; H03H 9/02574; H03H 9/568; H04L 5/14; H04J 1/12; H04B 1/40; H04B 1/44; H04B 1/48; H04B 1/50; H04B 2001/485
USPC ............ 333/133, 189, 193, 195; 455/78, 82; 370/201, 276, 278, 282
See application file for complete search history.

(56) References Cited

U.S. PATENT DOCUMENTS

| | | | | |
|---|---|---|---|---|
| 5,202,652 A | * | 4/1993 | Tabuchi ............ | H03H 9/1455 310/313 R |
| 6,380,823 B1 | * | 4/2002 | Ikata ................. | H03H 9/0576 333/133 |
| 6,759,924 B2 | * | 7/2004 | Sakuragawa ....... | H03H 9/0571 333/133 |

(Continued)

FOREIGN PATENT DOCUMENTS

| | | | |
|---|---|---|---|
| JP | 2004-088778 A | * | 3/2004 |
| JP | 2012-501564 A | | 1/2012 |
| JP | 2013-62556 A | | 4/2013 |

*Primary Examiner* — Barbara Summons
(74) *Attorney, Agent, or Firm* — Chen Yoshimura LLP

(57) ABSTRACT

A multiplexer includes: a first chip that has a first filter and a resonator, the first filter being connected between a common terminal and a first terminal, a first end of the resonator being connected to the common terminal not via the first filter; and a second chip that has a second filter, the second filter being connected between a second end of the resonator and a second terminal and having a pass band lower than that of the first filter, a resonance frequency of the resonator being higher than the pass band of the second filter.

9 Claims, 21 Drawing Sheets

(56) References Cited

U.S. PATENT DOCUMENTS

| | | | |
|---|---|---|---|
| 6,975,180 B2 * | 12/2005 | Nakamura | H03H 9/02929 333/133 |
| 2008/0246557 A1 * | 10/2008 | Kiwitt | H03H 9/0028 333/133 |
| 2011/0187478 A1 | 8/2011 | Link et al. | |
| 2011/0210805 A1 | 9/2011 | Link et al. | |
| 2012/0274417 A1 | 11/2012 | Kihara et al. | |

* cited by examiner

Frequency 1.72GHz～2.20GHz

Frequency 1.72GHz～2.20GHz

MULTIPLEXER

CROSS-REFERENCE TO RELATED APPLICATION

This application is based upon and claims the benefit of priority of the prior Japanese Patent Application No. 2014-080762, filed on Apr. 10, 2014, the entire contents of which are incorporated herein by reference.

FIELD

A certain aspect of the present invention relates to a multiplexer.

BACKGROUND

For example, in a mobile communication terminal, a plurality of signals having a different frequency band are input into and/or output from a common terminal. In this case, a multiplexer such as a duplexer is used. Japanese Patent Application Publication No. 2013-62556 discloses that a matching circuit is used when filters having a different pass band are connected to a common terminal. The matching circuit controls a reflection coefficient so that a signal of which frequency is different from a pass band of the matching circuit is input into a filter.

However, the matching circuit has a component such as an inductor and/or a capacitor. Therefore, the multiplexer gets larger.

SUMMARY OF THE INVENTION

According to an aspect of the present invention, there is provided a multiplexer including: a first chip that has a first filter and a resonator, the first filter being connected between a common terminal and a first terminal, a first end of the resonator being connected to the common terminal not via the first filter; and a second chip that has a second filter, the second filter being connected between a second end of the resonator and a second terminal and having a pass band lower than that of the first filter, a resonance frequency of the resonator being higher than the pass band of the second filter.

DETAILED DESCRIPTION

A description will be given of embodiments with reference to drawings.

First Embodiment

Figure 1:
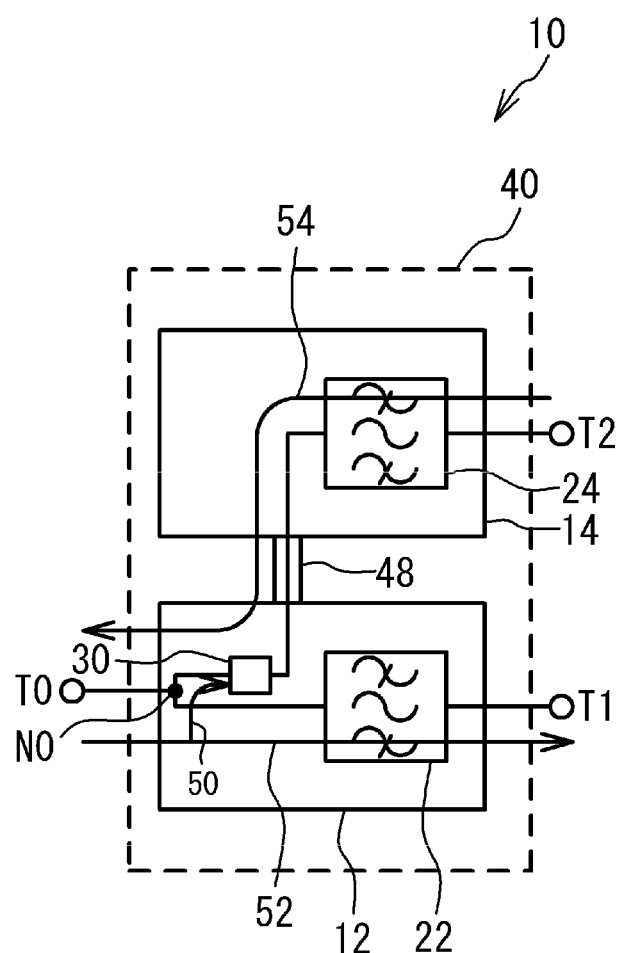
FIG. 1 illustrates a block diagram of a multiplexer in accordance with a first embodiment.

FIG. 1 illustrates a block diagram of a multiplexer in accordance with a first embodiment. A multiplexer 10 has a chip 12 and a chip 14. The chips 12 and 14 are mounted on a substrate 40. The substrate 40 is a package substrate or a printed substrate and has a ceramics layer having a single layer or multi layers or an insulating layer such as a resin layer. The chip 12 has a filter 22 and a resonator 30. The chip 14 has a filter 24. The filter 22 is connected between a common terminal T0 and a first terminal T1. The filter 24 is connected between the common terminal T0 and a second terminal T2. And the resonator 30 is connected between a common node N0 connected to the filters 22 and 24 and the filter 24. The resonator 30 is connected to the second filter 24 via an interconnection line 48 formed on the substrate 40.

Figure 2:
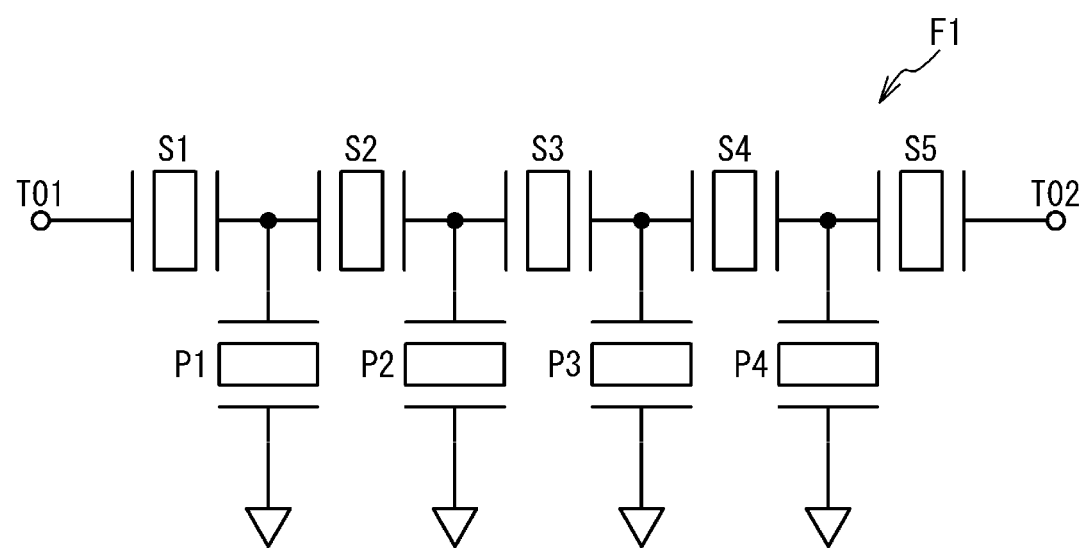
FIG. 2 illustrates a circuit diagram of an example of a ladder filter.

FIG. 2 illustrates a circuit diagram of an example of a ladder filter. As illustrated in FIG. 2, a ladder type filter F1 has one or more series resonators S1 to S5 and one or more parallel resonators P1 to P4. The series resonators S1 to S5 and the parallel resonators P1 to P4 are an acoustic wave resonator such as a surface acoustic wave resonator, an interface acoustic wave resonator, a love wave resonator, or a piezoelectric thin film resonator. The series resonators S1 to S5 are connected between the terminal T01 and the terminal T02 in series. The parallel resonators P1 to P4 are connected between the terminal T01 and the terminal T02 in parallel. At least one of the number of the series resonators and the parallel resonators and a connection relationship of the series resonators and the parallel resonators can be arbitrarily changed in accordance with a desirable characteristic. The ladder type filter F1 can be used as the filter 22 and the filter 24.

Figure 3A:
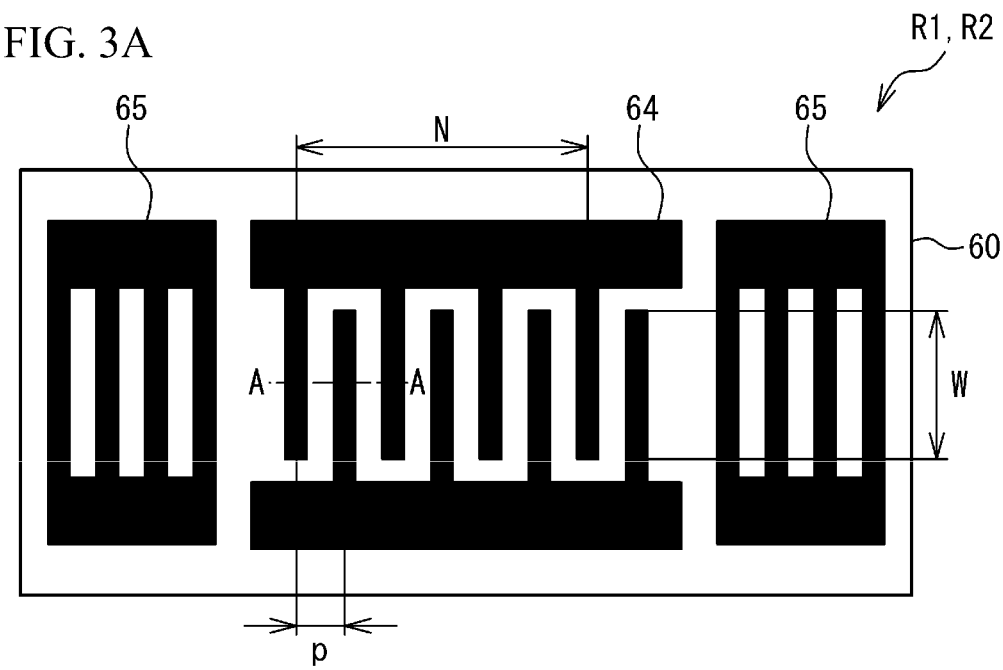
FIG. 3A illustrates a plane view of a surface acoustic wave resonator.
Figure 3B:
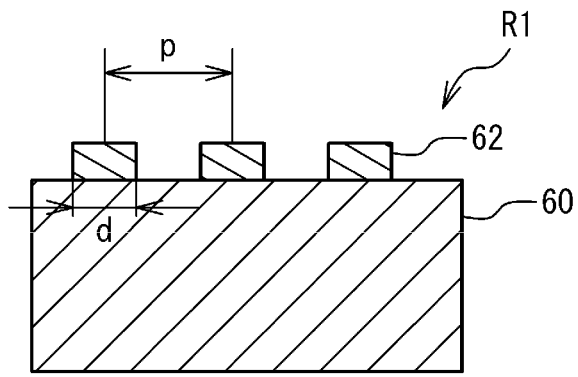
FIG. 3B illustrates an example of a cross sectional view taken along a line A-A of FIG. 3A.
Figure 3C:
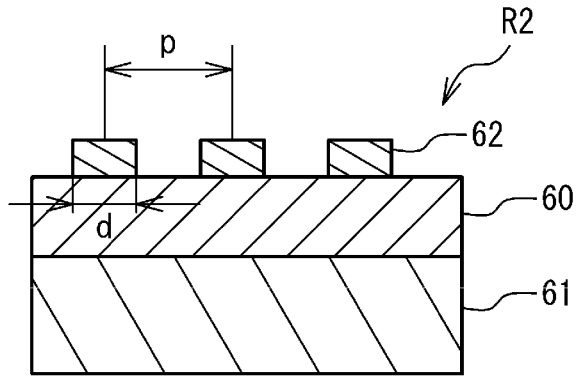
FIG. 3C illustrates another example of a cross sectional view taken along a line A-A of FIG. 3A.

FIG. 3A illustrates a plane view of a surface acoustic wave resonator. FIG. 3B illustrates an example of a cross sectional view taken along a line A-A of FIG. 3A. FIG. 3C illustrates another example of the cross sectional view taken along the line A-A of FIG. 3A. As illustrated in FIG. 3A and FIG. 3B, in a resonator R1, a metal film 62 is formed on a piezoelectric substrate 60. The piezoelectric substrate 60 is, for example, a lithium tantalate substrate or a lithium niobate substrate. The metal film 62 is an aluminum film or a copper film. An IDT (Interdigital Transducer) 64 and a reflector 65 are made of the metal film 62. The IDT 64 excites an acoustic wave. The reflector 65 is provided on both sides of a propagation direction of the acoustic wave of the IDT 64 and reflects the acoustic wave. A logarithm N of electrode fingers of the IDT 64, a pitch p of the electrode fingers, an opening length W, a width of the electrode fingers can be arbitrarily changed in accordance with a desirable characteristic.

As illustrated in FIG. 3A and FIG. 3C, in a resonator R2, the piezoelectric substrate 60 is adhered to a support substrate 61. The support substrate 61 is, for example, a sapphire substrate. Other structures are the same as the resonator R1. Therefore, an explanation of the structures is omitted.

The resonator R1 or R2 can be used as series resonators and parallel resonators of the filter F1. The resonators R1 and R2 can be used as the resonator 30. A description is given of the case where a surface acoustic wave resonator is used as the resonators R1 and R2. However, the resonators R1 and R2 may be an interface acoustic wave resonator or a love wave resonator.

Figure 4A:
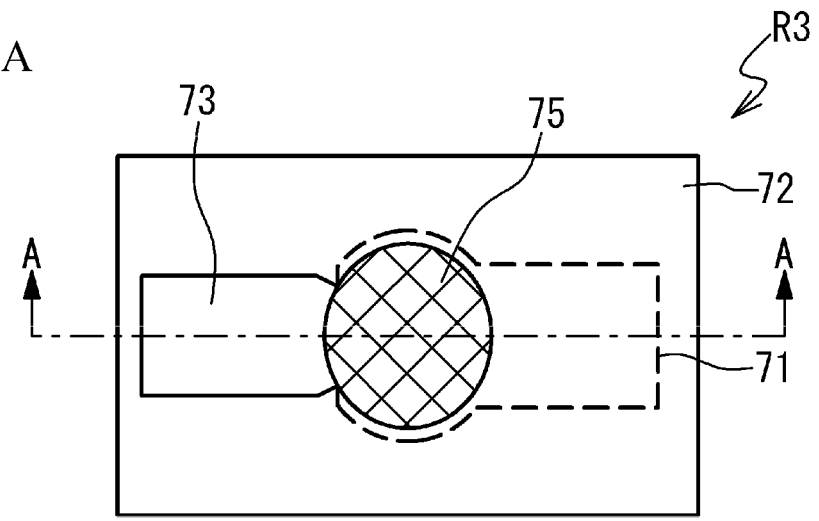
FIG. 4A illustrates a plane view of a piezoelectric thin film resonator.
Figure 4B:
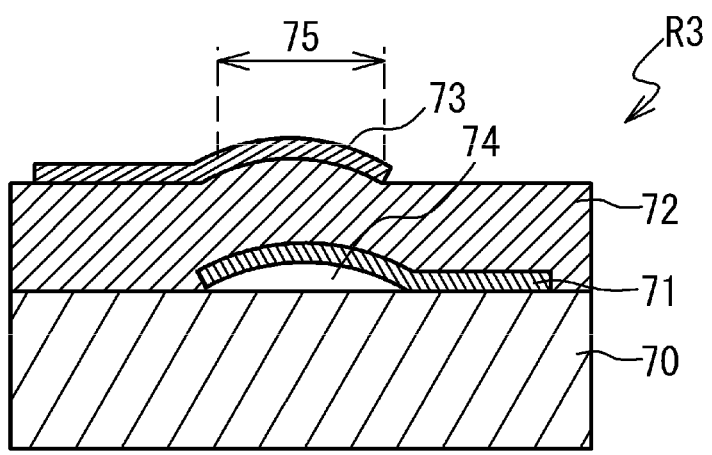
FIG. 4B illustrates a cross sectional view taken along a line A-A of FIG. 4A.

FIG. 4A illustrates a plane view of the piezoelectric thin film resonator. FIG. 4B illustrates a cross sectional view taken along a line A-A of FIG. 4A. In a resonator R3, a lower electrode 71, a piezoelectric film 72 and an upper electrode 73 are formed on a substrate 70. A region in which the lower electrode 71 and the upper electrode 73 sandwich the piezoelectric film 72 and face each other is a resonance region 75. A void 74 is formed under the lower electrode 71 in the resonance region 75. An acoustic mirror may be used instead of the void 74. The substrate 70 is a semiconductor substrate such a silicon substrate or a glass substrate or an insulating substrate. The piezoelectric film 72 is an aluminum nitride film or a zinc oxide. The lower electrode 71 and the upper electrode 73 are metal films. The resonator R3 can be used as the series resonators and the parallel resonators of the ladder type filter F1. The resonator R3 can be used as the resonator 30.

Figure 5:
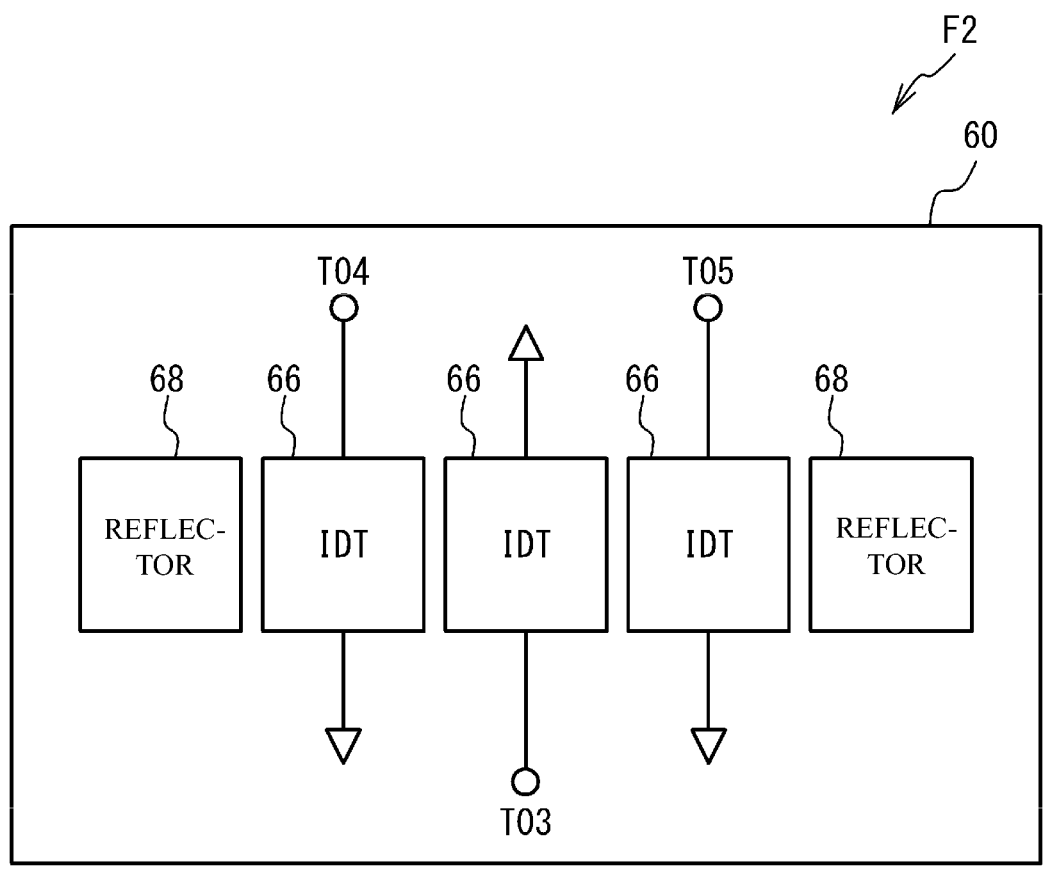
FIG. 5 illustrates a schematic plane view of a multi-mode type filter.

FIG. 5 illustrates a schematic plane view of a multi-mode type filter. As illustrated in FIG. 5, a multi-mode type filter F2 has three IDTs 66 and two reflectors 68 that are formed on the piezoelectric substrate 60. The IDTs 66 and the reflectors 68 are arrayed in a propagation direction of an acoustic wave. The IDT 66 of a center is connected between the terminal T03 and a ground. The IDT 66 of a left side is connected between the terminal T04 and the ground. The IDT 66 of a right side is connected between the terminal T05 and the ground. The structure of the IDT 66 and the reflector 68 is the same as that of the IDT 64 and the reflector 65 of the resonator R1 or R2. Therefore, an explanation of the structure is omitted. For example, the terminal T03 is an unbalanced input terminal. The terminals T04 and T05 are a balanced output terminal. The number of the IDT 66 and the reflector 68, the connection relationship of the IDT 66 and the reflector 68 and the number of the terminal can be arbitrarily changed in accordance with a desirable characteristic. The multi-mode type filter F2 can be used as the filter 22 and the filter 24.

Figure 6:
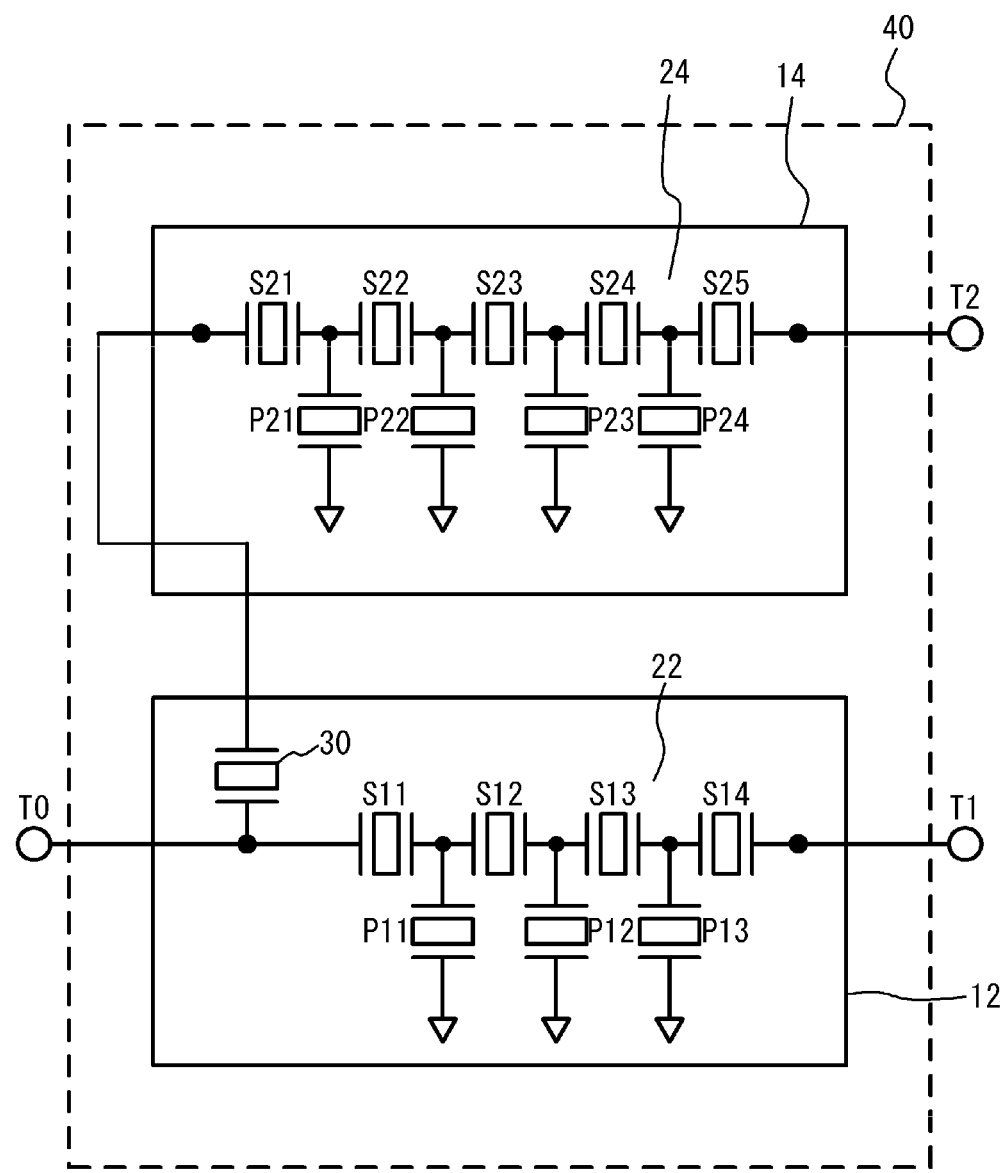
FIG. 6 illustrates a block diagram of a multiplexer of a first modified embodiment of a first embodiment.

FIG. 6 illustrates a block diagram of a multiplexer of a first modified embodiment of the first embodiment. As illustrated in FIG. 6, the filter 22 is a ladder type filter that has series resonators S11 to S14 and parallel resonators P11 to P13. The filter 24 is a ladder type filter that has series resonators S21 to S25 and parallel resonators P21 to P24. Other structures are the same as the first embodiment. Therefore, an explanation of the structures is omitted.

Figure 7:
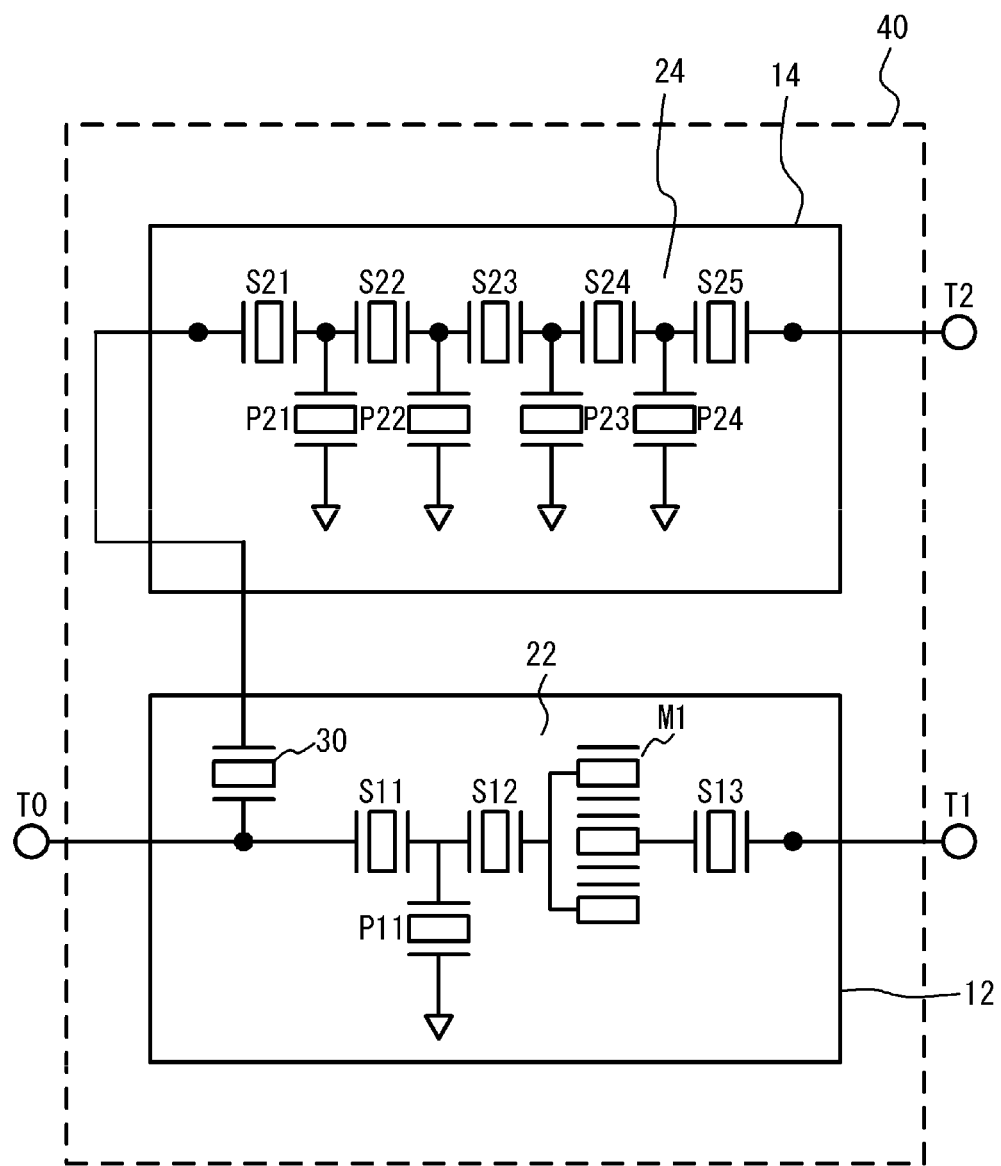
FIG. 7 illustrates a block diagram of a multiplexer of a second modified embodiment of a first embodiment.

FIG. 7 illustrates a block diagram of a multiplexer of a second modified embodiment of the first embodiment. As illustrated in FIG. 7, the filter 22 is a filter that has a ladder type filter having the series resonators S11 and S12 and the parallel resonator P1, the multi-mode type filter M1 and the resonator S13. The filter 24 is the same as that first modified embodiment of the first embodiment. Other structures are the same as the first embodiment. Therefore, an explanation of the structure is omitted.

As in the cases of the first modified embodiment and the second modified embodiment of the first embodiment, a ladder type filter, a multi-mode type filter, or a filter in which a ladder type filter and a multi-mode type filter are combined can be used as the filter 22 and the filter 24.

Figure 8:
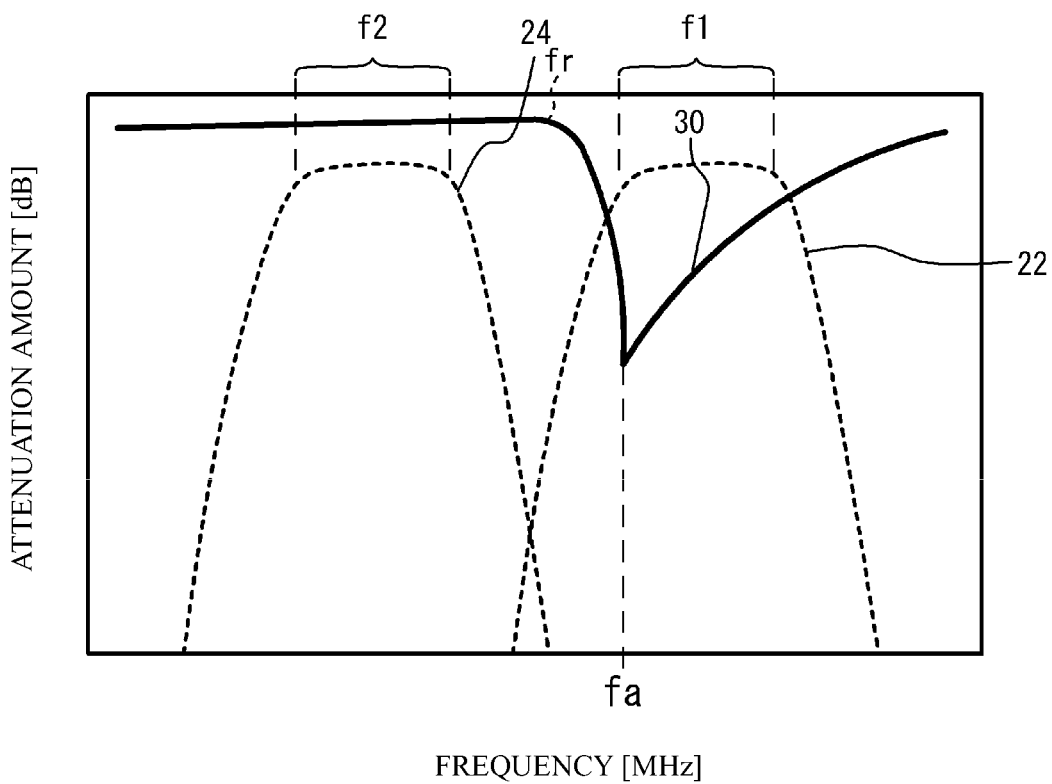
FIG. 8 illustrates a schematic view of an attenuation amount with respect to a frequency of a filter and a resonator.

FIG. 8 illustrates a schematic view of an attenuation amount with respect to a frequency of a filter and a resonator. In FIG. 8, a solid line indicates a pass characteristic of the resonator 30. A broken line indicates pass characteristics of the filter 22 and the filter 24. A pass band f1 of the filter 22 does not overlap with a pass band f2 of the filter 24. The pass band f1 is higher than the pass band of f2. A resonant frequency fr of the resonator 30 is higher than the pass band f2. Thus, a signal of the pass band f2 is hardly reflected by the resonator 30. On the other hand, a signal of the pass band f1 is reflected by the resonator 30. The resonant frequency fr is lower than the pass band f1. Thus, a reflection coefficient of the resonator in the pass band f1 can be enlarged. An anti-resonant frequency fa is approximately the same as a lower frequency edge of the pass band f1.

As illustrated in FIG. 1, the filter 22 is a receive filter, filters a receive signal 52 that is input from the common terminal t0 and outputs the filtered receive signal 52 to the terminal T1. A part 50 of the receive signal may be leaked from the node N0 to the filter 24. However, the resonator 30 reflects the signal (receive signal) of the pass band f1 of the filter 22. Therefore, intrusion of the receive signal into the filter 22 is suppressed. The filter 24 is a transmit filter, filters a transmit signal 54 that is input from the terminal T2, and outputs the filtered transmit signal 54 to the common terminal T0. In this case, the transmit signal 54 passes through the resonator 30. However, the resonator 30 hardly reflects the signal of the pass band f2 of the filter 22. In this manner, in the first embodiment, the resonator 30 suppresses the leakage of the signal of the pass band f1 to the filter 24. A description is given of the case where the filter 22 is a receive filter and the filter 24 is a transmit filter. However, the filters 22 and 24 may be a receive filter. The filters 22 and 24 may be a transmit filter. The filter 22 may be a transmit filter, and the filter 24 may be a receive filter.

As illustrated in FIG. 8, in the pass characteristic of the resonator 30, an attenuation amount rapidly decreases on the lower frequency side than the resonant frequency fr. The attenuation amount gradually decreases on the higher frequency side than the resonant frequency fr. It is assumed that the resonant frequency of the resonator 30 is near the pass band f2, and a signal of the pass band f2 is reflected. In this case, the band in which the attenuation amount gradually decreases overlaps the pass band f1, and a signal of the pass band f1 is reflected by the resonator 30. In this manner, when the resonator 30 is used, the resonator 30 having the higher resonant frequency fr than the pass band f2 is connected between the node N0 and the filter 24 having the low pass band f2.

It is preferable that the resonant frequency fr of the resonator 30 is higher than the pass band f2 and is within the pass band f1 or near the pass band f1 as illustrated in FIG. 8. The resonant frequencies fr of the resonators forming the filters 22 and 24 are respectively within the pass band f1 and pass band f2 or near the bands. Therefore, when the resonator 30 is formed in the chip 14, the resonant frequency fr of the resonator 30 is largely different from that of a resonator forming the filter 24.

It is difficult for the resonant frequencies fr of the resonator 30 to be largely different from each other in an identical chip. For example, in the resonators R1 and R2, the resonant frequency differs in accordance with a pitch of the electrode fingers. However, when the pitches of the electrode fingers are greatly different from each other, a dimension accuracy of the electrode fingers is degraded. In the resonator R3, the resonant frequency is changed in accordance with a film thickness of a lamination film of the resonance region. However, when the film thickness of the lamination film is changed, the number of the manufacturing processes increases.

And so, the resonator 30 is formed in the chip 12 having the filter 22. The resonant frequency fr of the resonator 30 is near the pass band f1. Therefore, it is relatively easy to form the resonator 30 in the chip 12.

In the first embodiment, the chip 12 (first chip) has the filter 22 (first filter) that is connected between the common terminal T0 and the terminal T1 (first terminal) and the resonator of which first edge is connected to the common terminal T0 not via the filter 22. The chip 14 has the filter 24 that is connected between the second edge of the resonator 30 and the terminal T2 (second terminal). And, the pass band f2 of the filter 24 is lower than the pass band f1 of the filter 22. The resonant frequency fr of the resonator 30 is higher than the pass band of the filter 24. Thus, the resonator 30 suppresses the intrusion of the signal of the pass band f1 into the filter 24. When the resonator 30 is formed in the chip 12 having the filter 22, the resonator and the filter can be integrated. It is therefore possible to downsize the multiplexer.

It is preferable that the resonant frequency fr of the resonator 30 is within the pass band f1 or is higher than the pass band f2 and lower than the pass band f1 as illustrated in FIG. 8. In this case, it is possible to suppress the leakage of the signal of the pass band f1 to the filter 24.

When the filter 22 and the filter 24 are at least one of a ladder type filter and a multi-mode type filter, the resonant frequency fr of the resonator 30 gets closer to the resonant frequency of the resonator forming the filter 22. Therefore, in this case, it is more effective that the resonator 30 is formed in the chip 12 having the filter 22.

In the resonator R1 illustrated in FIG. 3A and FIG. 3B, when the pitch of the electrode fingers of the IDT is changed, it is relatively easy to make resonators having a different resonant frequency in an identical chip (an identical substrate). It is difficult for spurious or the like to occur in the resonance characteristic. In the resonator R2 illustrated in FIG. 3A and FIG. 3C, it is relatively easy to make resonators having a different frequency in an identical chip (an identical substrate), as in the case of the resonator R1. However, it is easy for the spurious or the like to occur in the resonance characteristic because of an interface between the support substrate 61 and the piezoelectric substrate 60. In the resonator R3 illustrated in FIG. 4A and FIG. 4B, the number of manufacturing processes increases when resonators having a different frequency in an identical chip (an identical substrate) are manufactured.

In this manner, in the resonator R2, it is easy for the spurious to occur in the resonance characteristic. In the resonator R3, it is difficult to make resonators having a different resonant frequency in an identical substrate. It is therefore preferable that the filter 22 and the resonator 30 are the resonator R1. That is, it is preferable that the filter 22 and the resonator 30 have a surface acoustic wave resonator, an interface acoustic wave resonator or a love wave resonator that are formed on the piezoelectric substrate 60 that is not adhered to the support substrate 61

The filter 24 is not formed in the same chip as the resonator 30. Therefore, it is preferable that the filter 24 has a piezoelectric thin film resonator or has a surface acoustic wave resonator, an interface acoustic wave resonator or a love wave resonator that are formed on the piezoelectric substrate 60 that is adhered to the support substrate 61.

It is preferable that an insertion loss of the resonator 30 in the pass band f2 is small. It is therefore preferable that the resonator 30 is large. When the filter 22 is a ladder-type filter, it is preferable that the resonator 30 is larger than an average size of resonators (series resonators and parallel resonators) forming the filter 22. It is more preferable that the resonator 30 is larger than an average size of the series resonators. When the resonator 30 is a surface acoustic wave resonator, an interface acoustic wave resonator or a love wave resonator, the size of the resonator 30 is proportional to the logarithm of the IDT 64 X an opening length W. When the resonator 30 is a piezoelectric thin film resonator, the size of the resonator 30 is proportional to an area of the resonance region 75.

Second Embodiment

Figure 9:
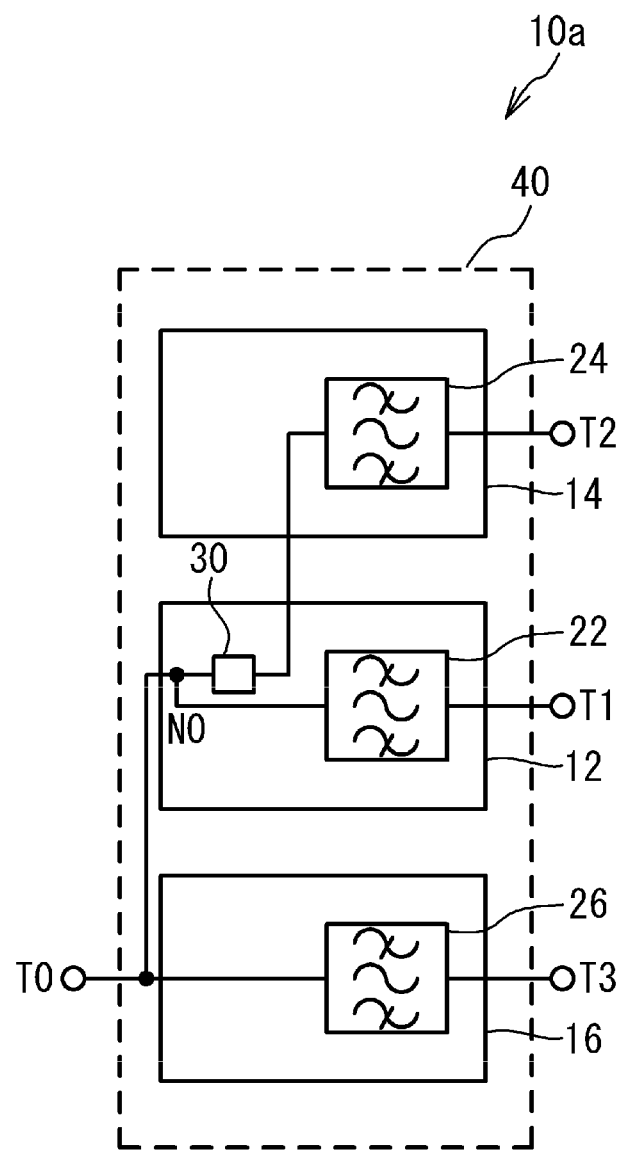
FIG. 9 illustrates a block diagram of a multiplexer in accordance with a second embodiment.

A second embodiment is an example in which there are three or more filters. FIG. 9 illustrates a block diagram of a multiplexer in accordance with a second embodiment. As illustrated in FIG. 9, in a multiplexer 10a, a chip 16 having a filter 26 is mounted on the substrate 40. The filter 26 is connected between the common terminal T0 and the terminal T3. The filter 26 has a pass band that is different from those of the filters 22 and 24. The filter 26 may be a receive filter or a transmit filter. Other structures are the same as the first embodiment. Therefore, an explanation of the structures is omitted.

Figure 10:
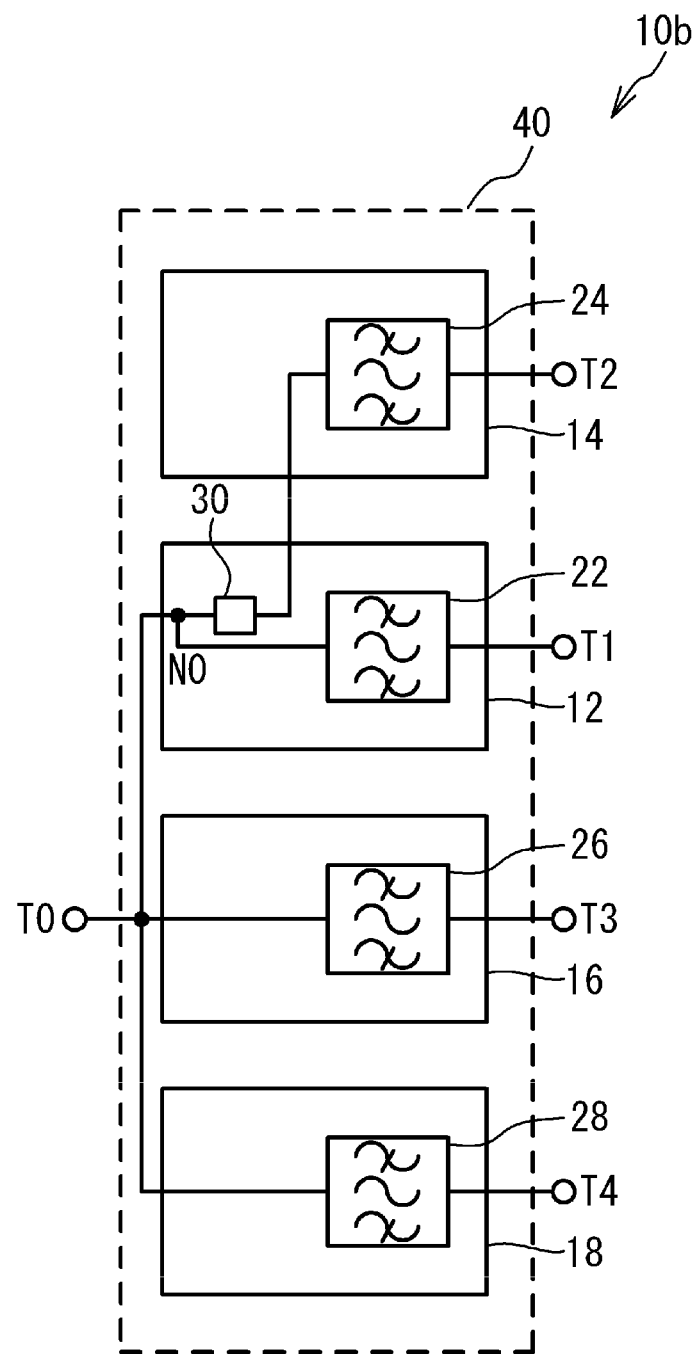
FIG. 10 illustrates a block diagram of a multiplexer in accordance with a first modified embodiment of a second embodiment.

FIG. 10 illustrates a block diagram of a multiplexer in accordance with a first modified embodiment of the second embodiment. As illustrated in FIG. 10, in a multiplexer 10b, a chip 18 having a filter 28 is mounted on the substrate 40. The filter 28 is connected between the common terminal T0 and the terminal T4. The filter 28 has a pass band that is different from those of the filters 22, 24 and 26. The filter 28 may be a receive filter or a transmit filter. Other structures are the same as the second embodiment. Therefore, an explanation of the structures is omitted.

Figure 11:
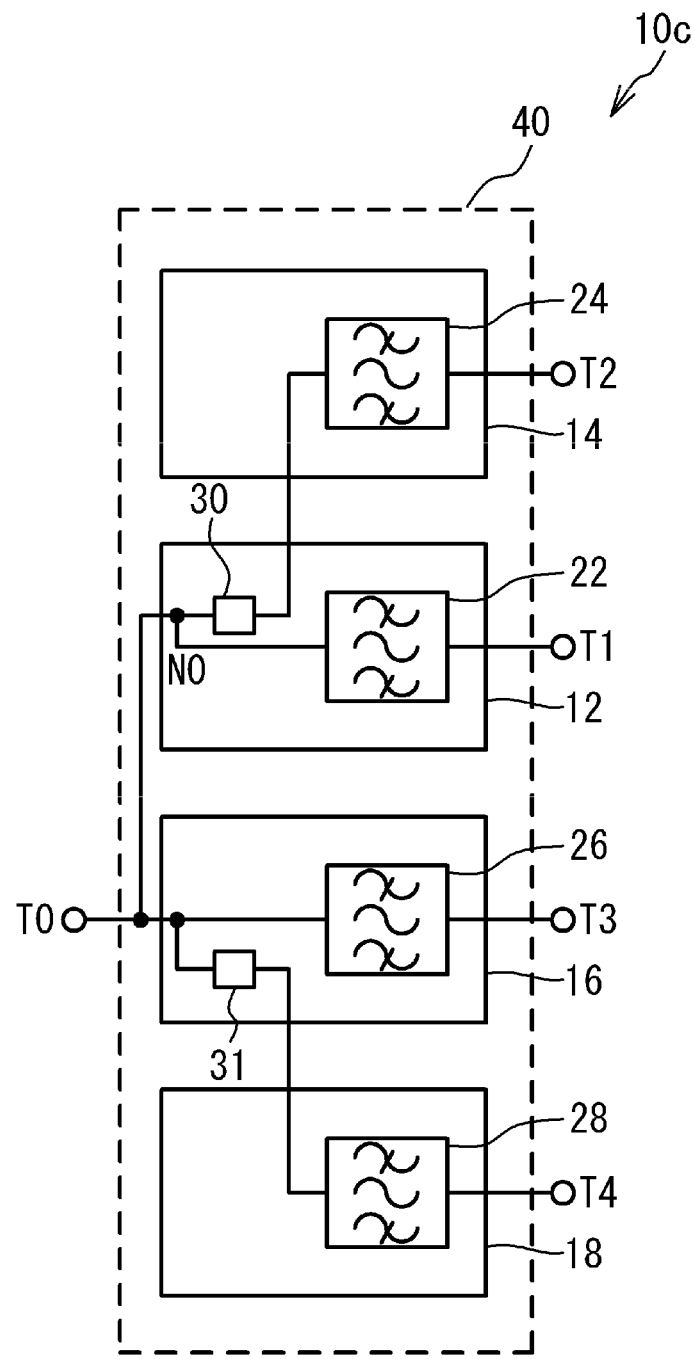
FIG. 11 illustrates a block diagram of a multiplexer in accordance with a second modified embodiment of a second embodiment.

FIG. 11 illustrates a block diagram of a multiplexer in accordance with a second modified embodiment of the second embodiment. As illustrated in FIG. 11, in a multiplexer 10c, a resonator 31 is formed in the chip 16. A first edge of the resonator 31 is connected to the common terminal T0. A second edge of the resonator 31 is connected to the filter 28. The pass band of the filter 26 is higher than that of the filter 28. The resonant frequency of the resonator 31 is higher than the pass band of the filter 28. Other structures are the same as the first modified embodiment of the second embodiment. Therefore, an explanation of the structures is omitted.

As in the case of the second embodiment and the modified embodiments thereof, the multiplexer 10a may have the chip 16 (third chip) having the filter 26 (third filter). As in the case of the first modified embodiment of the second embodiment, the multiplexer 10b may have the chip 18 (fourth chip) having the filter 28 (fourth filter). Further, as in the case of the second modified embodiment of the second embodiment, the chip 18 may have the resonator 31. The multiplexer may have five or more filters.

Third Embodiment

Figure 12:
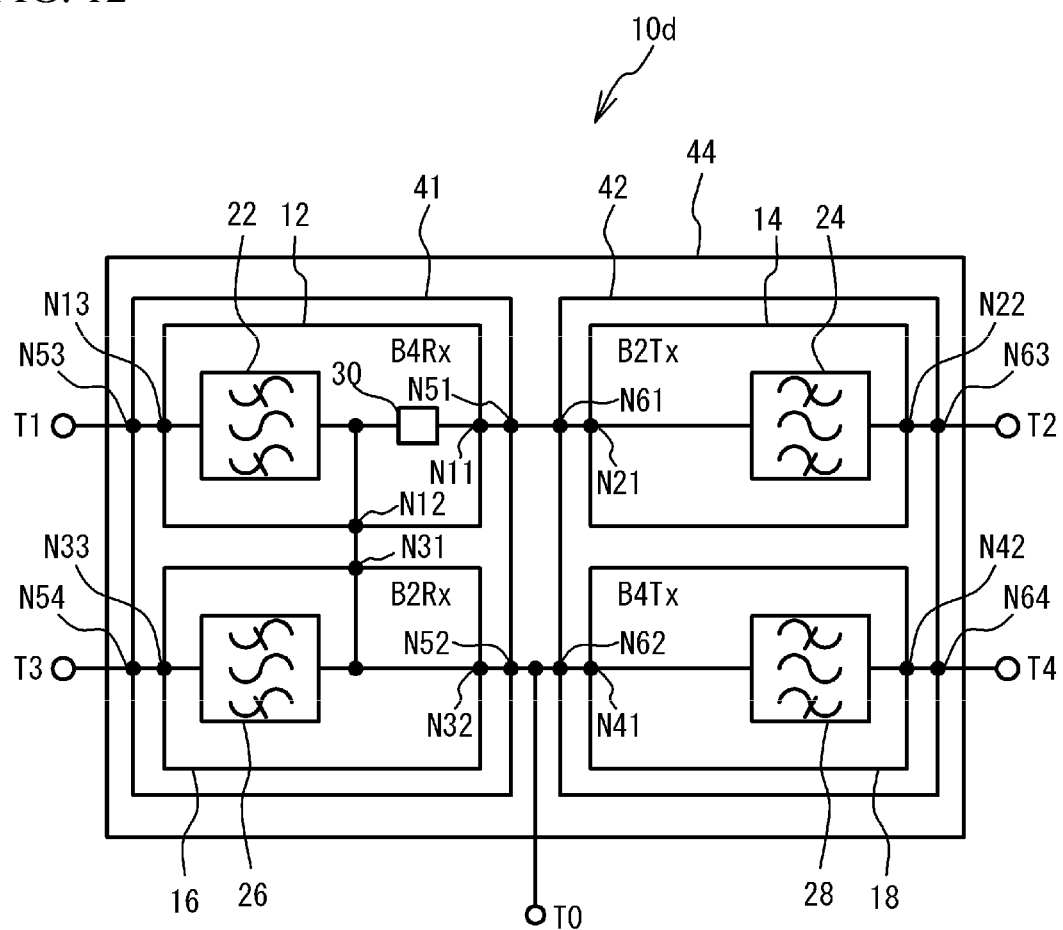
FIG. 12 illustrates a block diagram of a multiplexer in accordance with a third embodiment.

FIG. 12 illustrates a block diagram of a multiplexer in accordance with a third embodiment. As illustrated in FIG. 12, in a multiplexer 10d, the chips 12 and 16 are mounted on a substrate 41. The chips 14 and 18 are mounted on a substrate 42. The substrates 41 and 42 are mounted on a substrate 44. The substrates 41 and 42 are a multi-layer ceramics substrate. The substrate 44 is a multi-layer resin substrate (printed substrate) or the like.

The filters 22, 24, 26 and 28 are respectively a receive filter B4Rx of a band 4 (first band), a transmit filter B2Tx of a band 2 (second band), a receive filter B2Rx of the band 2 and a transmit filter B4Tx of the band 4. The filter 24 is connected to the common terminal T0 via the resonator 30 formed in the chip 12 and via the chip 16. The filter 22 is connected to the common terminal T0 via the chip 16.

Nodes N11 to N13 are nodes where the chip 12 is electrically connected to the substrate 41. Nodes N31 to N33 are nodes where the chip 16 is electrically connected to the substrate 41. Nodes N21 and N22 are nodes where the chip 14 is electrically connected to the substrate 42. Nodes N41 and N42 are nodes where the chip 18 is electrically connected to the substrate 42. Nodes N51 to N54 are nodes where the substrate 41 is electrically connected to the substrate 44. Nodes N61 to N64 are nodes where the substrate 42 is electrically connected to the substrate 44.

Figure 13A:
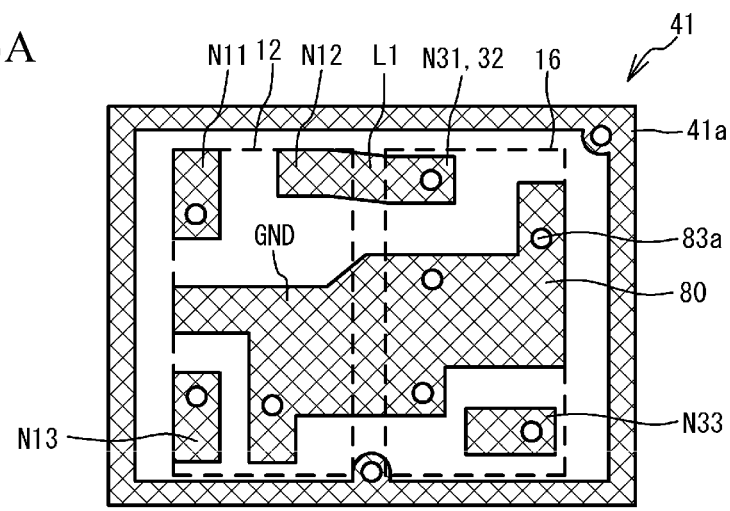
FIG. 13A to FIG. 13C illustrate a plane view of each layer of a substrate 41.
Figure 13B:
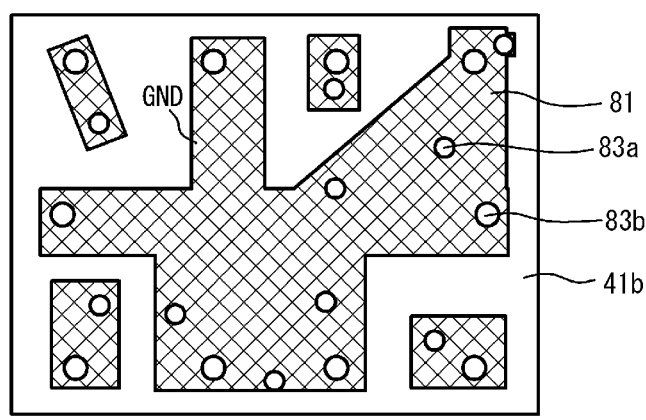
Figure 13C:
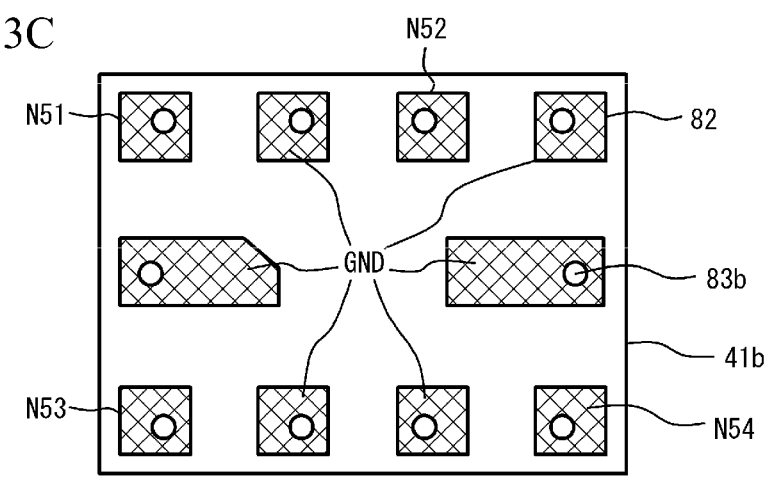

FIG. 13A to FIG. 13C illustrate a plane view of each layer of the substrate 41. FIG. 13A illustrates a plane view of an upper face of a layer 41a. FIG. 13B illustrates a plane view of an upper face of a layer 41b. FIG. 13C illustrates a plane view of a lower face of the layer 41b that is viewed from an upper side. As illustrated in FIG. 13A to FIG. 13C, a pad 80 is formed on the upper face of the layer 41a. And, an interconnection line 81 is formed on the upper face of the layer 41b. A pad 82 is formed on the lower face of the layer 41b. A via 83a penetrates the layer 41a. A via 83b penetrates the layer 41b. In FIG. 13A to FIG. 13C, the via 83b is illustrated more largely than the via 83a. The layers 41a and 41b are insulating layers such as a ceramics. The pads 80 and 82, the interconnection line 81, and the vias 83a and 83b are metal layers such as Cu.

The chips 12 and 16 are flip-chip mounted on the upper face of the layer 41a of FIG. 13A. The codes N11 to N13 and N31 to N33 are added to pads of the pads 80 acting as the nodes of FIG. 12. The rest of the pads 80 are mainly ground pads GND. The pad 80 is connected to the interconnection line 81 formed on the upper face of the layer 41b via the via 83a. The interconnection line 81 is connected to the pad 82 formed on the lower face of the layer 41b via the via 83b.

The pads corresponding to the nodes of FIG. 12 of the pads 82 are the nodes N51 to N54. The rest of the pads are mainly ground pads GND.

Figure 14A:
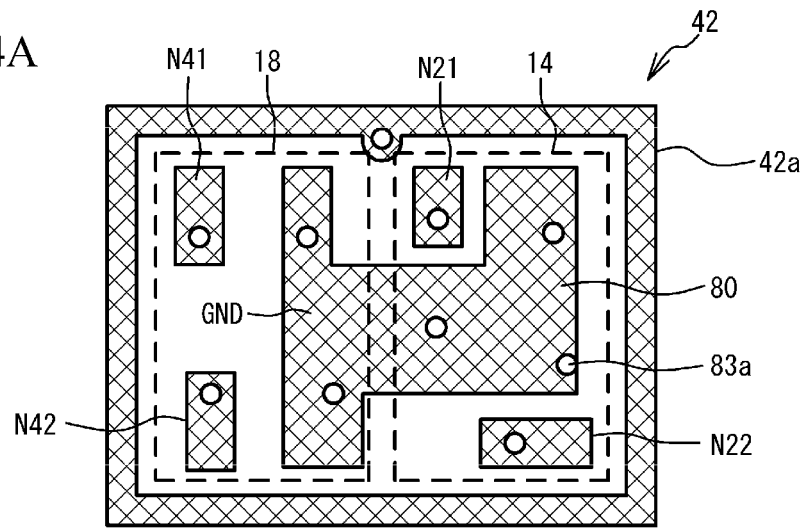
FIG. 14A to FIG. 14C illustrate a plane view of each layer of a substrate 42.
Figure 14B:
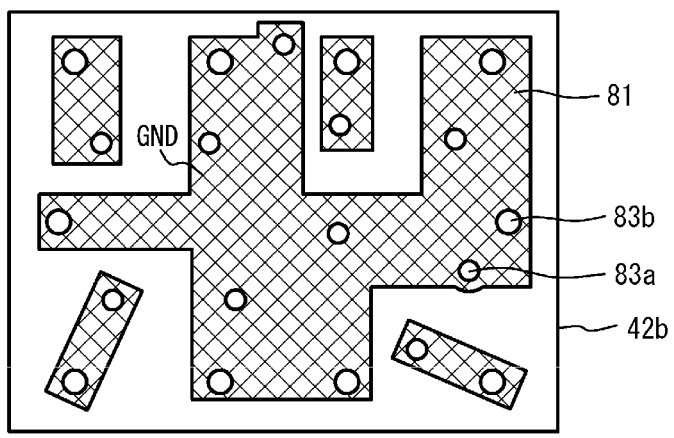
Figure 14C:
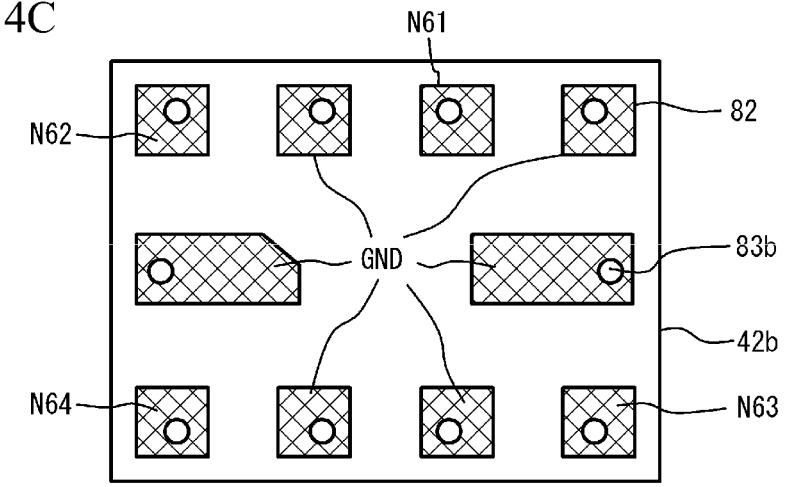

FIG. 14A to FIG. 14C illustrate a plane view of each layer of the substrate 42. FIG. 14A illustrates a plane view of an upper face of a layer 42a. FIG. 14B illustrates a plane view of an upper face of a layer 42b. FIG. 14C illustrates a plane view in which a lower face of the layer 42b is seen-through from above. As illustrated in FIG. 14A to FIG. 14C, there are provided the pads 80 and 82, the interconnection line 81, the vias 83a and 83b as well as FIG. 13A to FIG. 13C. These materials are the same as those of FIG. 13A to FIG. 13C. Therefore, an explanation of the materials is omitted.

The chips 14 and 18 are mounted on the upper face of the layer 42a of FIG. 14A through a bump. The codes N21, N22, N41 and N42 are added to pads of the pads 80 corresponding to the nodes of FIG. 12. The rest of the pads 80 are mainly ground pads GND. The pads 80 are connected to the interconnection line 81 that is formed on the upper face of the layer 42b. The interconnection line 81 is connected to the pads 82 that are formed on the lower face of the layer 42b through the vias 83b. The codes N61 to N64 are added to pads of the pads 82 corresponding to the nodes of FIG. 12. The rest of the pads 82 are mainly ground pads GND.

Figure 15:
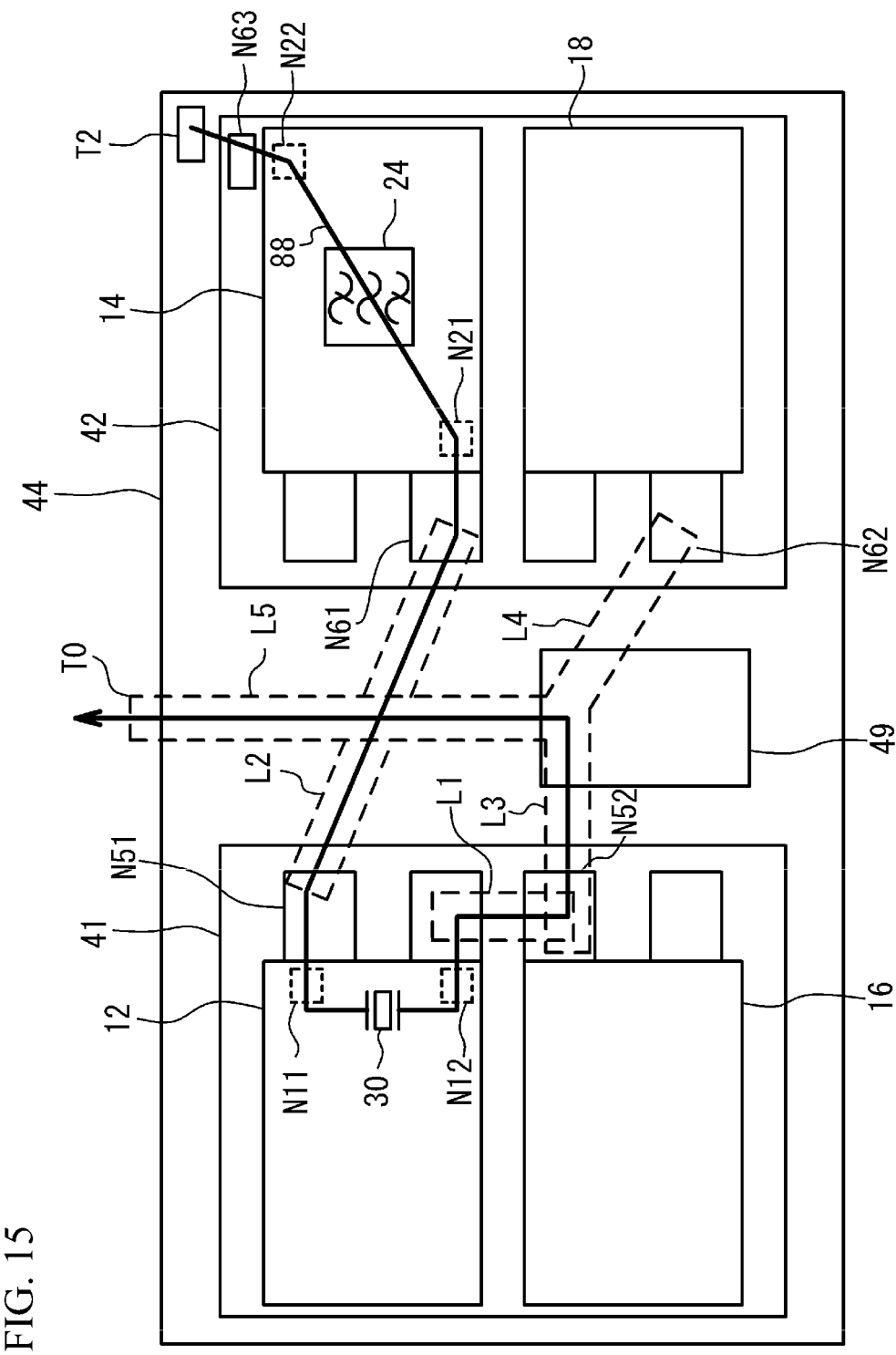
FIG. 15 illustrates a plane view of a substrate 44.

FIG. 15 illustrates a plane view of the substrate 44. Components other than pads and interconnection lines for describing are not illustrated. As illustrated in FIG. 15, the substrates 41 and 42 and an inductor 49 are mounted on the substrate 44 with use of solders or the like. The chips 12 to 18 are mounted on the substrates 41 and 42. The interconnection line L1 is formed in the substrate 41. The interconnection line L1 is an interconnection line L1 connecting the pad N12 and the pad N31 in FIG. 13A. The interconnection lines L2 to L5 are formed in the substrate 44. The interconnection line L2 connects a pad corresponding to the node N61 of the substrate 42 and a pad corresponding to the node N52 of the substrate 41. The interconnection line L3 connects the pad corresponding to the node N52 of the substrate 41 and a first edge of the inductor 49. The interconnection line L4 connects a pad corresponding to the node N62 of the substrate 44 and the first edge of the inductor 49. The interconnection line L5 connects the first edge of the inductor 49 to an antenna (the common terminal T0). A second edge of the inductor 49 is connected to the ground. The interconnection line L2 crosses the interconnection line L5 in the substrate 44, sandwich an insulating layer and are spaced from each other.

For example, in FIG. 15, an arrow 88 indicates a path where a transmit signal input from the terminal T2 of FIG. 12 is output from the common terminal T0. The transmit signal input into the terminal T2 is input into the chip 14 via the pads corresponding to the nodes N63 and N22. The transmit signal passes through the filter 24 and is input into the interconnection line L2 from the pads corresponding to the pads N21 and N61. The transmit signal is input into the chip 12 via the pads corresponding to the node N51 and N11. The transmit signal passes through the resonator 30 formed in the chip 12. The transmit signal passes through the interconnection line L1 in the substrate 41 via the node N12 from the chip 12. The transmit signal is input into the interconnection line L3 of the substrate 44 from the pad corresponding to the node N52 via the node N31 (not illustrated in FIG. 15). The transmit signal reaches the common terminal T0 via the interconnection lines L3 and L5.

The filter characteristic of the third embodiment was simulated. In the simulation, the filter 22 (B4Rx) is the filter in which a ladder type filter and a multi-mode type filter are combined. Each resonator is a surface acoustic wave resonator of the resonator R1 type using a lithium tantalate substrate. The filter 24 (B2Tx) is a ladder type filter. Each resonator is a surface acoustic wave resonator of the resonator R2 type in which a lithium tantalate substrate is adhered on a sapphire substrate. The filter 26 (B2Rx) is a ladder type filter. Each resonator is a piezoelectric thin film resonator of the resonator R3 type using a silicon substrate. The filter 28 (T4Tx) is a ladder type filter. Each resonator is a surface acoustic wave resonator of the resonator R1 type using a lithium tantalate substrate.

Figure 16:
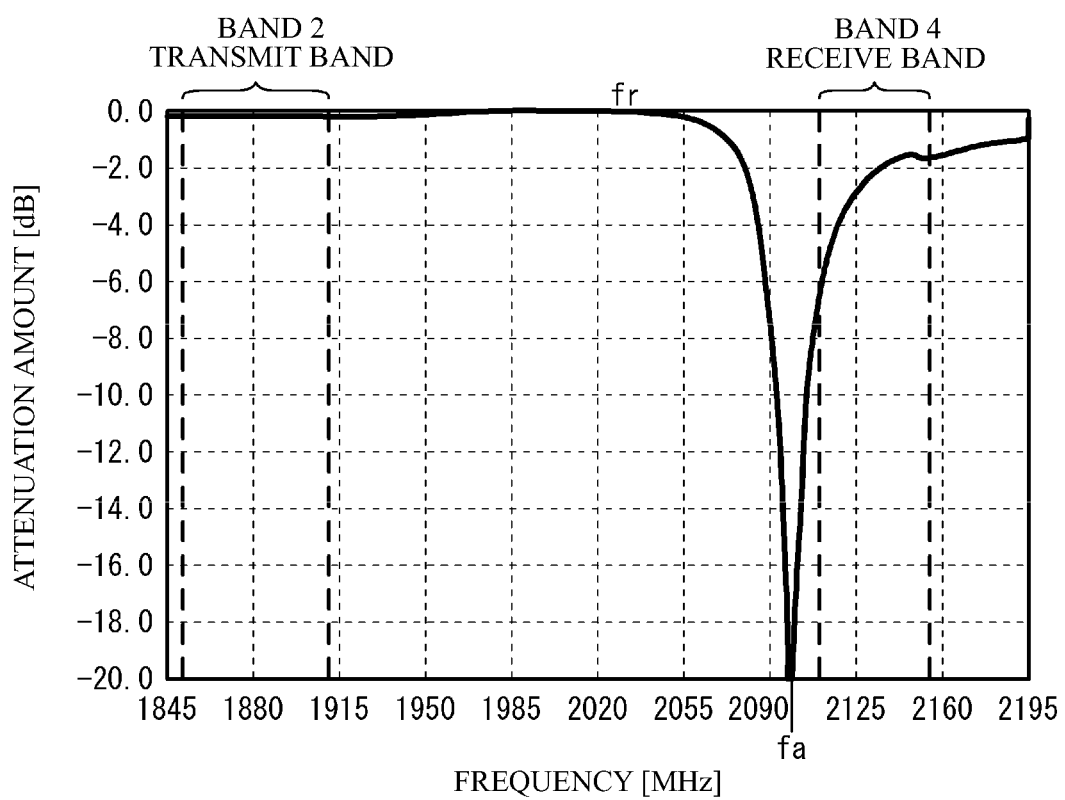
FIG. 16 illustrates pass characteristics of resonators.

FIG. 16 illustrates pass characteristics of resonators used in the simulation. As illustrated in FIG. 16, a transmit band of the band 2 is 1850 MHz to 1910 MHz. A receive band of the band 4 is 2110 MHz to 2155 MHz. A resonant frequency Fr and an anti-resonant frequency fa of the resonator 30 are slightly on the low frequency side of the receive band so that a signal in the receive band of the band 4 is not leaked to the filter 24 (B2Tx).

Figure 17:
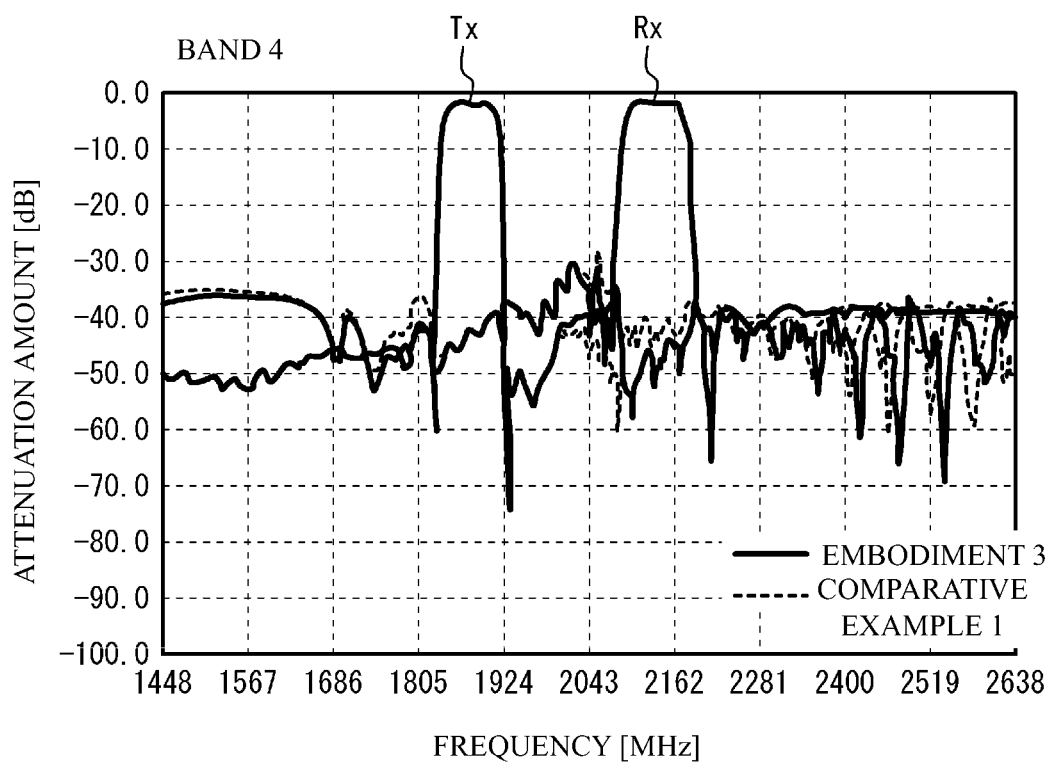
FIG. 17 illustrates pass characteristics of a transmit filter and a receive filter of a band 4.

FIG. 17 illustrates pass characteristics of the transmit filter and the receive filter of the band 4. A solid line indicates the third embodiment. A broken line indicates a first comparative example that does not have the resonator 30. The pass characteristic of the transmit filter is Tx. The pass characteristic of the receive filter is Rx. As illustrated in FIG. 17, a characteristic of an attenuation region of the third embodiment is approximately the same as that of the first comparative example.

Figure 18:
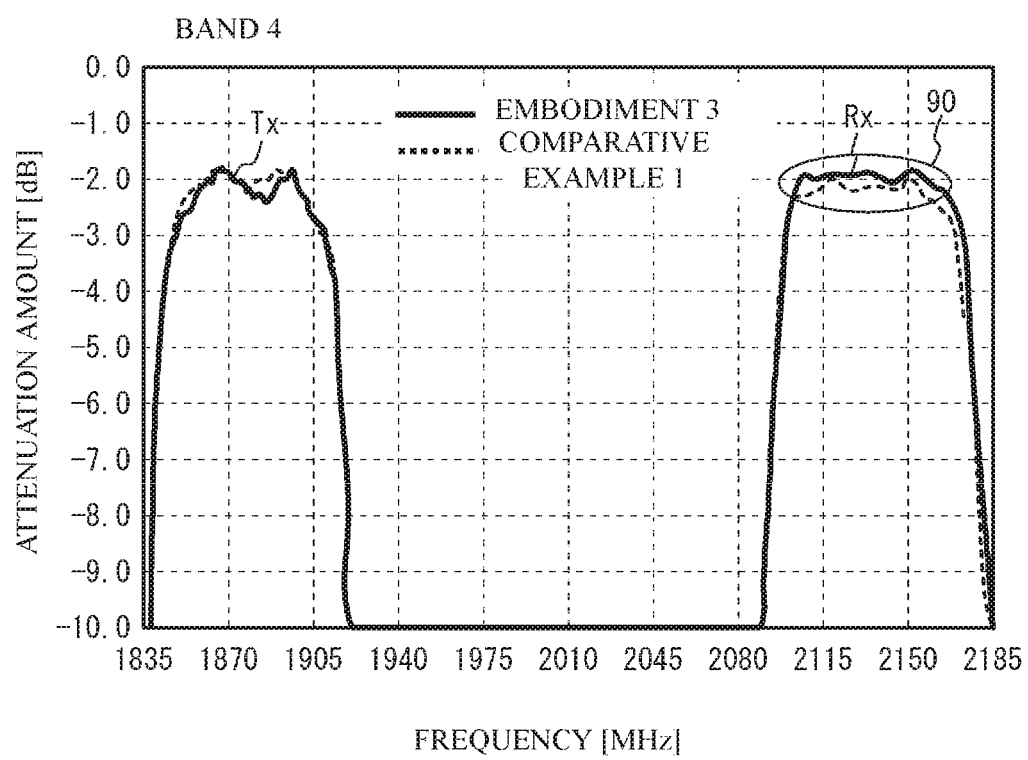
FIG. 18 illustrates pass characteristics near pass bands of a transmit filter and a receive filter of a band 4.

FIG. 18 illustrates pass characteristics near the pass bands of the transmit filter and the receive filter of the band 4. As illustrated in FIG. 18, in a pass band 90 of the receive filter, a loss of the third embodiment is smaller than that of the first comparative example. This is because although in the first comparative example, a part of the receive signal of the band 4 is leaked to the filter 24, in the third embodiment, the resonator 30 can suppress the leakage of the receive signal of the band 4 to the filter 24.

Figure 19:
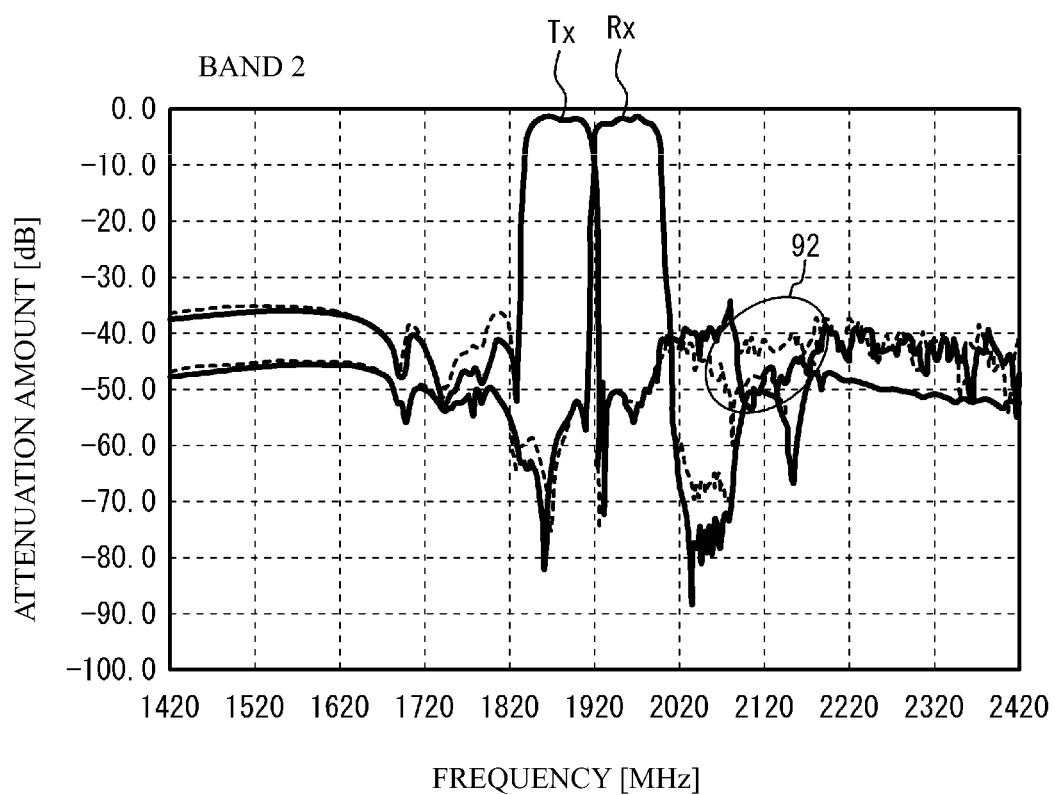
FIG. 19 illustrates pass characteristics of a transmit filter and a receive filter of a band 2.

FIG. 19 illustrates pass characteristics of the transmit filter and the receive filter of the band 2. As illustrated in FIG. 19, in a vicinity 92 around 2100 MHz on the high frequency side of the receive band, the attenuation characteristic of the transmit filter of the third embodiment is improved more than that of the first comparative example. This is because a leakage of a signal around the receive band of the band 2 to the filter 24 (B4Tx) is suppressed by the resonator 30.

Figure 20:
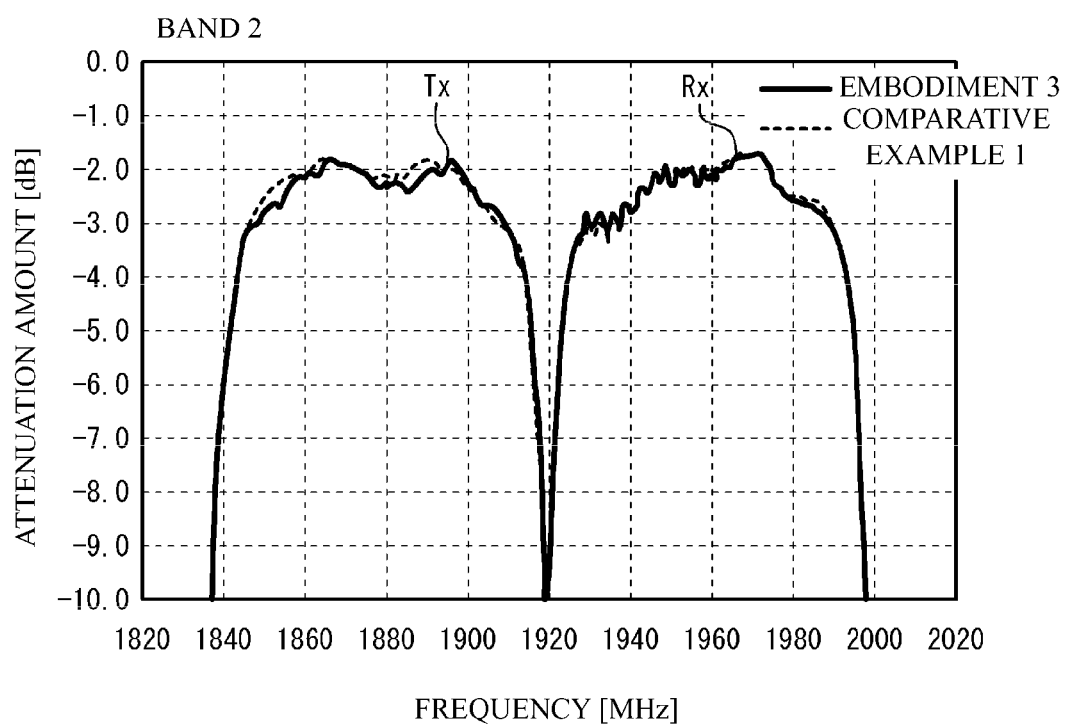
FIG. 20 illustrates pass characteristics around a pass band of a transmit filter and a receive filter of a band 2.

FIG. 20 illustrates pass characteristics around the pass band of the transmit filter and the receive filter of the band 2. As illustrated in FIG. 20, the pass characteristic of the third embodiment is approximately the same as that of the first comparative example.

In this manner, when the resonator 30 is provided, the pass characteristic of the filter 22 can be improved and the attenuation characteristic of the filter 24 can be improved.

Figure 21A:
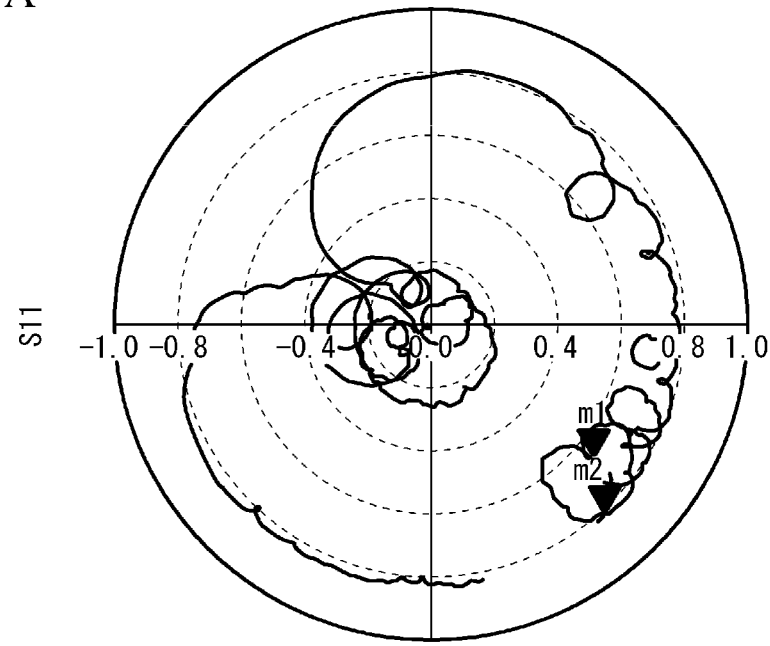
FIG. 21A and FIG. 21B respectively illustrate smith charts indicating a reflection characteristic S11 of a resonator 30 that are viewed from a common terminal T0 of a first comparative example and a third embodiment.
Figure 21B:
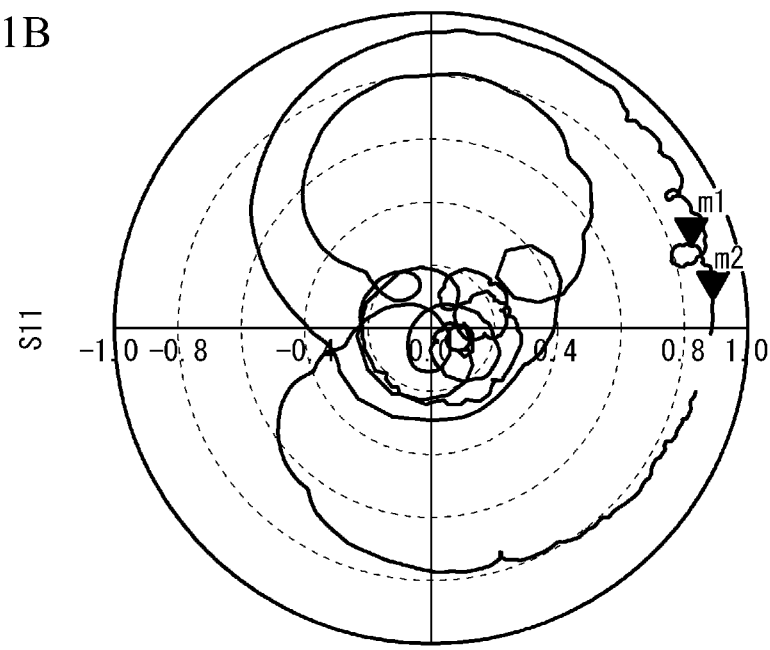

FIG. 21A and FIG. 21B respectively illustrate smith charts indicating a reflection characteristic S11 of the resonator 30 that are viewed from the common terminal T0 of the first comparative example and the third embodiment. A low frequency end of 2.110 GHz of the receive band of the band 4 is illustrated with a marker m1. A high frequency end of 2.155 GHz of the receive band of the band 4 is illustrated with a marker m2. As illustrated in FIG. 21A, magnitudes of the reflection characteristic S11 at 2.110 GHz and 2.155 GHz of the first comparative example are respectively 0.691 and 0.812. Phase angles are respectively −48 degrees and −39 degrees. As illustrated in FIG. 21B, magnitudes of the reflection characteristic S11 at 2.110 GHz and 2.155 GHz of the third embodiment are respectively 0.858 and 0.894. Phase angles are respectively 18 degrees and 5 degrees.

In this manner, in the third embodiment, it is possible to enlarge the reflection coefficient of the resonator 30 in the receive band of the band 4 more than the first comparative example. This is because the resonant frequency fr of the resonator 30 of the third embodiment is lower than the receive band of the band 4 (that is, the pass band of the filter 22). On a presumption that the resonant frequency fr is located in the receive band of the band 4, the reflection coefficient of the resonator 30 in the receive band of the band 4 is reduced. In the third embodiment, when the resonator 30 is inserted, the leakage of the receive signal of the band 4 to the filter 24 can be suppressed. And, in order to suppress the signal leakage, the reflection characteristic of the resonator 30 is used. Therefore, the structure in which a path connecting the resonator 30 and the ground is not used can be achieved.

In the third embodiment, as illustrated in FIG. 12 and FIG. 15, the chip 12 (first chip) and the chip 16 (third chip) are mounted on the substrate 41 (first substrate). The chip 14 (second chip) and the chip 18 (fourth chip) are mounted on the substrate 42 (second substrate). The substrate 41 and the substrate 42 are mounted on the substrate 44 (third substrate). As illustrated in FIG. 15, the substrate 44 has the interconnection line L2 (first interconnection line) connecting the resonator 30 and the filter 24. In this manner, when the interconnection line L2 is provided in the substrate 44, the chip 12 and the chip 14 can be mounted on the substrates 41 and 42 that are different from each other.

As illustrated in FIG. 15, the substrate 41 has the interconnection line L1 (second interconnection line) that connects the node N31 of the filter 26 on the common terminal side and the node N12 of the resonator 30 in common. The substrate 44 has the interconnection line L1 and the interconnection lines (L3 to L5) that connect the nodes of the filter 28 to the common terminal. Thus, the filter 24 is connected to the common terminal T0 via the chips 12 and the chip 16. And, the filter 22 is connected to the common terminal T0 via the chip 16. On the other hand, the filters 26 and 28 are connected to the common terminal T0 not via another chip.

In the third embodiment, the receive filters 22 and 26 are mounted on the substrate 41, and the transmit filters 24 and 28 are mounted on the substrate 42. The receive filter 22 and the transmit filter 28 may be mounted on the substrate 41. The receive filter 26 and the transmit filter 24 may be mounted on the substrate 42. In this manner, the filters mounted on a substrate can be arbitrarily combined in order to achieve a desirable characteristic. Further, the number of the filter may be 5 or more.

The present invention is not limited to the specifically described embodiments, but other embodiments and variations may be made without departing from the scope of the claimed invention.

What is claimed is:
1. A multiplexer comprising:
a first chip that has a first filter and a resonator, the first filter being connected between a common terminal and a first terminal, a first end of the resonator being connected to the common terminal not via the first filter; and
a second chip that has a second filter, the second filter being connected between a second end of the resonator and a second terminal and having a pass band lower than that of the first filter, a resonance frequency of the resonator being higher than the pass band of the second filter, wherein the first filter has a surface acoustic wave resonator, an interface acoustic wave resonator or a love wave resonator that is formed on a piezoelectric substrate that is not adhered to a support substrate that is the same size as the piezoelectric substrate, and wherein the second filter has a piezoelectric thin film resonator, a surface acoustic wave resonator, an interface acoustic wave resonator or a love wave resonator, the surface acoustic wave resonator, the interface acoustic wave resonator and the love wave resonator being formed on a piezoelectric substrate that is adhered to a support substrate that is the same size as the piezoelectric substrate.

2. The multiplexer as claimed in claim 1, wherein the resonance frequency of the resonator is lower than the pass band of the first filter.

3. The multiplexer as claimed in claim 1, wherein the resonance frequency of the resonator is within the pass band of the first filter or lower than the pass band of the first filter.

4. The multiplexer as claimed in claim 1 further comprising a substrate that has an interconnection line connecting the second end of the resonator and the second filter, the first chip and the second chip being mounted on the substrate.

5. A multiplexer comprising:
a first chip that has a first filter and a resonator, the first filter being connected between a common terminal and a first terminal, a first end of the resonator being connected to the common terminal not via the first filter; and
a second chip that has a second filter, the second filter being connected between a second end of the resonator and a second terminal and having a pass band lower than that of the first filter,
a resonance frequency of the resonator being higher than the pass band of the second filter,
wherein:
the first filter is a ladder type filter; and
the resonator is larger than an average size of resonators forming the first filter.

6. A multiplexer further comprising:
a first chip that has a first filter and a resonator, the first filter being connected between a common terminal and a first terminal, a first end of the resonator being connected to the common terminal not via the first filter; and
a second chip that has a second filter, the second filter being connected between a second end of the resonator and a second terminal and having a pass band lower than that of the first filter,
a third chip that has a third filter, the third filter being connected between the common terminal and a third terminal and having a pass band that is different from the pass bands of the first filter and the second filter,
a resonance frequency of the resonator being higher than the pass band of the second filter.

7. The multiplexer as claimed in claim 6 further comprising:
a first substrate on which the first chip and the third chip are mounted;
a second substrate on which the second chip is mounted; and
a third substrate on which the first substrate and the second substrate are mounted,
the third substrate having a first inter connection line that connects the second end of the resonator and the second filter.

8. The multiplexer as claimed in claim 7, wherein the first substrate has a second interconnection line that connects a node of the third filter on the common terminal side to a node of the resonator on the first end of the resonator in common.

9. The multiplexer as claimed in claim 8 further comprising a fourth chip that has a fourth filter, the fourth filter being connected between the common terminal and a fourth terminal and having a pass band that is different from those of the first filter, the second filter and the third filter,
wherein:
the fourth chip is mounted on the second substrate and
the third substrate has a third interconnection line that connects the second interconnection line and a node of the fourth filter on the common terminal side to the common terminal in common.

* * * * *